United States Patent [19]

Lymn

[11] Patent Number: 5,155,926
[45] Date of Patent: Oct. 20, 1992

[54] CIRCUIT BOARD DRYER HAVING ANGLED, OFFSET AIR JET NOZZLES

[76] Inventor: Peter P. A. Lymn, 1+2 Limeworks Cottage, Buriton, Petersfield, Hampshire, United Kingdom

[21] Appl. No.: 603,529

[22] Filed: Oct. 26, 1990

[30] Foreign Application Priority Data

Oct. 28, 1989 [GB] United Kingdom ............... 89243531

[51] Int. Cl.$^5$ .................... F26B 19/00; F26B 13/26; F26B 25/06
[52] U.S. Cl. ............................................. 34/155; 34/217
[58] Field of Search ................................. 34/155, 217

[56] References Cited

U.S. PATENT DOCUMENTS

| | | | |
|---|---|---|---|
| 3,543,410 | 12/1970 | Trachtenberg | 34/41 X |
| 3,579,853 | 5/1971 | Martino | 34/218 |
| 3,805,316 | 4/1974 | Sheppard | 15/309.2 |
| 3,863,360 | 2/1975 | Stievenari et al. | 34/155 |
| 4,017,982 | 4/1977 | Goffredo | 34/23 X |
| 4,523,391 | 6/1985 | Smith et al. | 34/155 X |
| 4,551,926 | 11/1985 | Aufderhaar | 34/155 X |
| 4,569,658 | 2/1986 | Wiggins et al. | 34/217 X |
| 4,575,982 | 3/1986 | Bodenan et al. | 34/155 X |
| 4,693,014 | 9/1987 | Caflisch et al. | 34/155 X |
| 4,750,277 | 6/1988 | Kuhl | 34/217 |

*Primary Examiner*—Henry A. Bennet
*Assistant Examiner*—Christopher B. Kilner
*Attorney, Agent, or Firm*—Ware, Fressola, Van Der Sluys & Adolphson

[57] ABSTRACT

A board dryer comprises a double-sided conveyor for conveying flat boards through a dryer, the conveyor defining a flat board path and a conveyance direction in the path through the dryer. The dryer also comprises a pair of nozzle devices, which are elongate and arranged to extend laterally across the board path with respect to the conveyance direction, one above the board path and one below it, for directing respective laterally extensive air jets towards the board path from opposite sides thereof. The air jets have a backward component of direction with respect to a forward conveyance direction for facilitating board drying. The board dryer is especially useful for drying printed circuit boards.

16 Claims, 2 Drawing Sheets

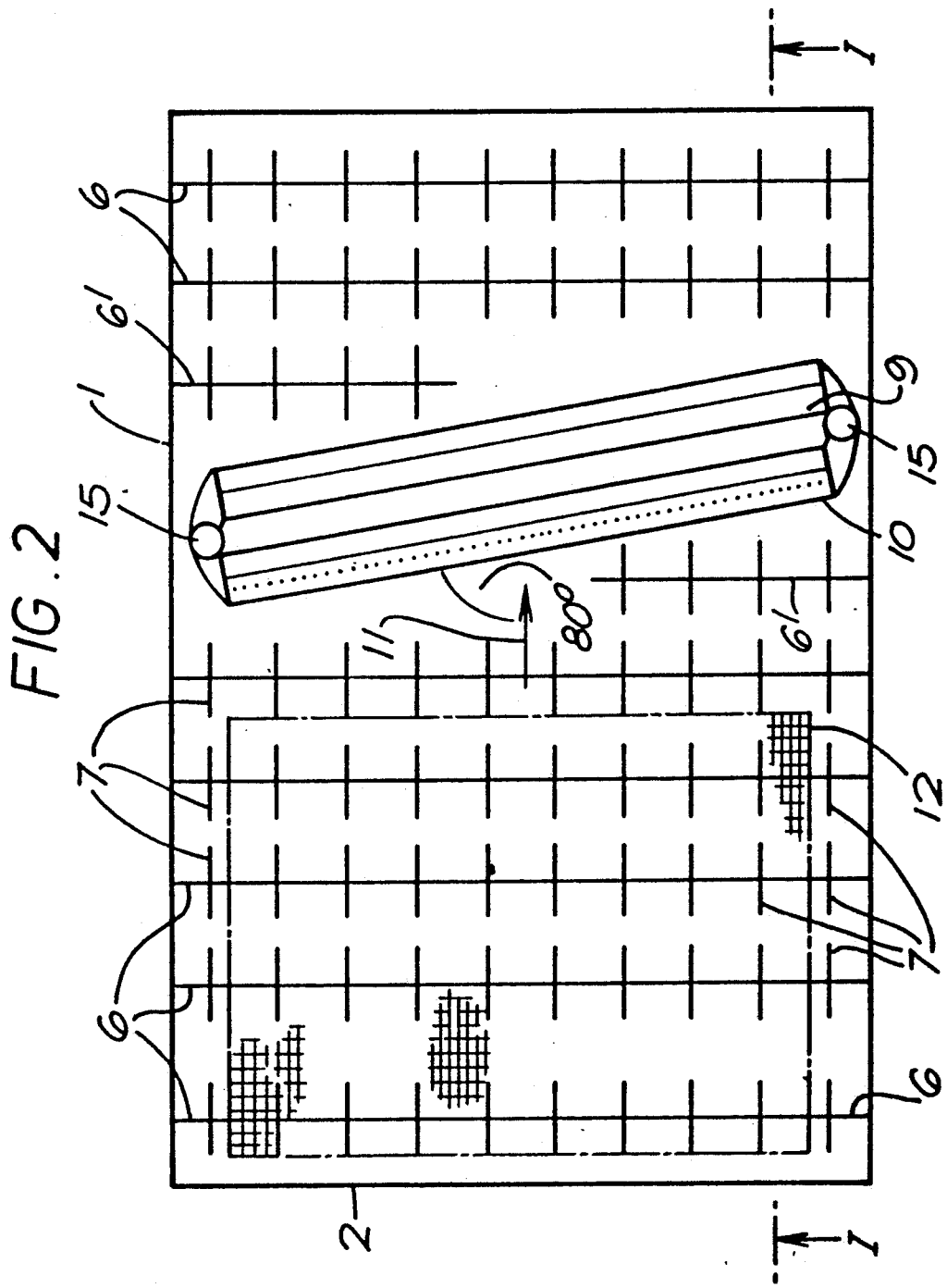

CIRCUIT BOARD DRYER HAVING ANGLED, OFFSET AIR JET NOZZLES

The present invention relates to a dryer for drying boards, particularly though not exclusively printed circuit boards about to be tinned in a solder leveler.

For tinning of printed circuit boards, it is important that they are thoroughly clean, which involves washing and drying. Many dryers exist, but they can suffer from defects in being not always totally effective and/or making inefficient use of energy supplied to them.

The object of this invention is to provide a simple efficient dryer.

A board dryer according to the invention comprises:
a conveyor for conveying boards through the dryer, the conveyor defining a flat board path and a conveyance direction in the path through the dryer; and
a pair of nozzle devices, which are elongate and arranged to extend laterally across the board path with respect to the conveyance direction, one above the board path and one below it, for directing respective laterally extensive air jets towards the board path from opposite sides thereof.

Preferably, the nozzle devices are arranged with their length oblique with respect to the conveyance direction. This oblique angle may be between 90° and 70° to the conveyance direction, but is preferably between 85° and 75° to this direction.

Further it is preferred that the nozzle devices are angled with respect to the board path to give the air jets a backwards component of direction with respect to the forwards conveyance direction. This backwards angle may in the extreme be between 45° and a right angle to the conveyance direction and conveniently between 50° and 70° to this direction. Preferably the backwards angle is between 55° and 65° to the forwards conveyance direction.

The elongate nozzle devices may include single slit nozzles or a plurality of individual nozzles spaced along their length. In either case, or variants thereof, the resultant air jet will be generally planar and extended laterally of its flow direction.

The effect of moving a wet board between the pair of nozzle devices will be to drive water backwards of the board's forwards movement in the conveyance direction. When the air jets are oriented obliquely, the water will be moved towards one side edge of the board, where some of the water will be blown off the board. Since the majority of boards are square, the corner at the opposite side end of the trailing edge of the board will reach the air jets first. Water here will be blown off or along the board, with little or no tendancy for an extended drop of water to adhere to the edge as it passes through the air jets nor for such an extended drop to be blown back over the other side of the panel by a jet on the one side of it. The points of intersection of the trailing edge with the air jets progressively moves along the trailing edge with the result that a small drop only is left on the last corner of the board to pass the jets and this is readily blown off.

The pair of nozzle devices are preferably parallel but offset, whereby bores through the board are first cleared of water from one side by one of the air jets. The air jets do not directly oppose each other and consequently do not leave the bores uncleared.

In order to fully locate the board as it passes between the nozzle devices, the conveyor is preferably a double-sided conveyor, conveniently comprising upper and lower wheels between which the board is gripped. In the region of the nozzle devices, the conveyor may comprise short lines of wheels not extending to the full width of the conveyor to support the board ends on entry and exit between the nozzle devices.

The dryer preferably includes board inlet baffles to avoid water blown from the board being blown out of the dryer. The inlet baffles comprise upper and lower baffles defining an inlet slot therebetween. They may be provided with closure means such as resilient rollers for complete closure of the inlet slot.

Conveniently the air for the air jets is heated. This may be achieved via radiant or conductive heaters, but is preferably achieved thermodynamically in a fan, conveniently a multi-stage fan, for providing pressure air to the nozzle devices. The air is preferably re-circulated within an enclosure of the dryer, being drawn from the enclosure to the fan and fed from the fan back to the nozzle devices. The temperature of the air may be controlled via opening of a flap in the enclosure by a thermostatic device in the event of the temperature of the air within the enclosure reaching a pre-determined level. Alternatively the control may be by bleeding ambient air into a return duct to the fan.

To help understanding of the invention, a specific embodiment thereof will now be described by way of example with reference to the accompanying drawings, in which:

FIG. 2 is a plan view of the dryer with a top cover removed; and

Figure 1:
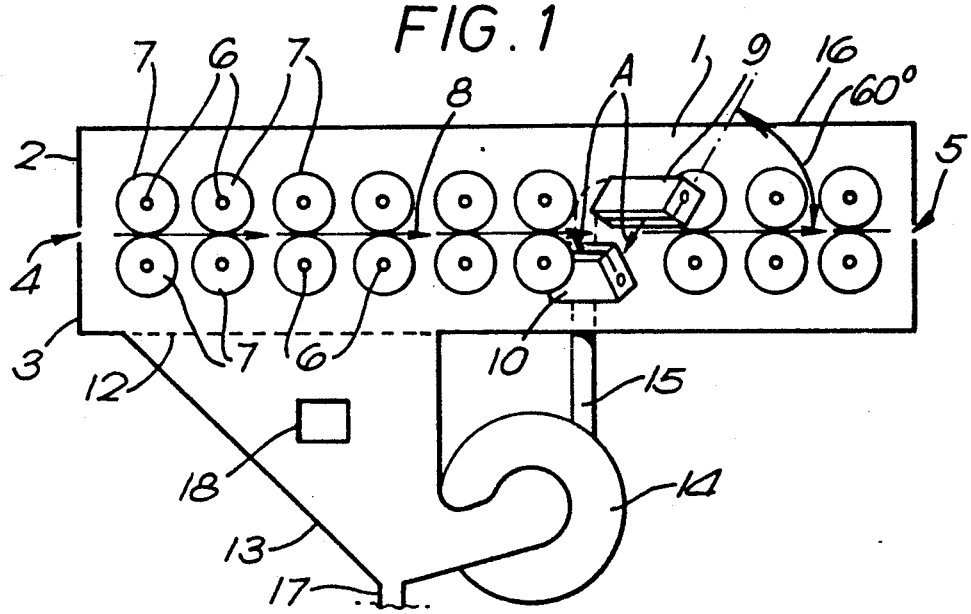
FIG. 1 is a cross-sectional side view of a dryer of the invention sectioned on line I—I in FIG. 2.

The dryer shown in the drawing has a cabinet 1 which is substantially enclosed a board path through the dryer. At a board inlet side of the cabinet, a pair of upper and lower baffle plates 2,3 define a board inlet slot 4. A similar slot 5 is provided in the board exit side of the cabinet. Between the slots 4,5 extends a conveyor comprising a plurality of shafts 6 in two layers carrying wheels 7. The latter are arranged in pairs between which boards are moved through the dryer on a board path 8. The shafts are all ganged together by a drive arrangement and a drive motor is provided. These details are conventional and not shown.

The conveyor has an oblique gap occupied by upper and lower nozzle devices 9,10, which are similar to solder leveler air knives and will be referred to as such. The air knives are set at an oblique angle, typically 80°, to the conveyance direction 11—at right angles to the shafts 6. The lower air knife 10 is arranged slightly upstream of the upper air knife 9. Means—not shown—is provided for adjusting the height of the air knives. In the triangular spaces between the air knives and the full width shafts 6 immediately up- and down-stream of the air knives, short shafts 6' with wheels 7 are provided for location of the boards close to the air knives, which can exert considerable force on the boards via their air jets.

The cabinet has a filter grid 12 beneath the conveyor up-stream of the air knives. Beneath the grid, ducting 13 leads to a multi-stage fan 14 driven by a motor not shown. The fan both heats and pressurizes air, which is supplied to the air knives via further ducting 15 typically at 40° C. and 0.15 bar above atmospheric pressure (2½ psig). The top of the cabinet is closed by glass panels 16 for viewing of boards being dried.

In use, a wet board, typically from a wash station immediately up-stream, is passed to the dryer via the inlet slot 4 and conveyed to the air knives. These, as shown in FIG. 1, are angled from the conveyance direction at 60° to give air jets A from them with a component of velocity towards the inlet for blowing water off the board in that direction. The board first encounters the upper air knife 9 which blows water from the top surface of the board and clears its bores. The lower air knife 10 is closely down-stream and blows water from the bottom surface of the board. As the board is moved through the air knives, the water is progressively blown off until the trailing edge of the board approaches the air knives. This passes progressively through and is progressively cleared of residual droplets clinging to it.

The air and removed water passes into the ducting 12, with any extraneous debris collected by the grid 11. The water passes into a drain 17. The air is sucked into the fan 13 and re-circulated to the air knives. Should the air temperature rise above 40° C., a vent 18 in the ducting 12 opens and ambient air is sucked in to cool the re-circulating air.

Figure 3:
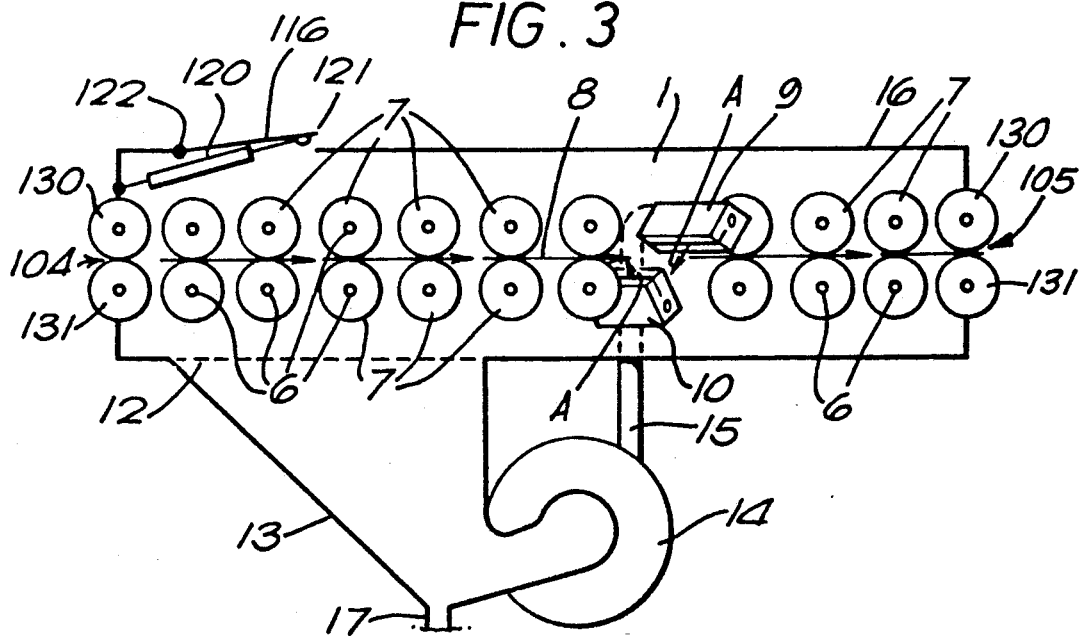
FIG. 3 shows in a view similar to FIG. 1 a variant of the dryer shown in FIG. 1.

In a variant illustrated in FIG. 3, one 116 of the glass top panels is fitted with a thermostatic opening device 120, of the type used in green-houses, which automatically lifts an edge 121 of the panel 116 opposite from a pivotted edge 122. Thus hot air is allowed to escape and be replaced by cooler, ambient air. The panel is opened further in accordance with the margin by which the air temperature exceeds 40° C., whereby the temperature is automatically controlled to be close to 40° C. In this variant, the board inlet and outlet slots 4,5 are replaced by pairs of upper and lower rollers 130,131 at the inlet and outlet 104,105 to the cabinet, the rollers being driven at the same peripheral speed as the wheels 7 and effectively closing the inlet and outlet to air passage.

I claim:

1. A double sided board dryer for drying printed circuit boards comprising:
   a double-sided conveyor for conveying boards through the dryer, said conveyor comprising a plurality of upper and lower axles arranged to extend across the width of the conveyor, each axle carrying a plurality of board gripping wheels attached thereto, the wheels on the upper axles being arranged opposite the corresponding wheels on the lower axles, said conveyor defining a flat board path and a conveyance direction in the path through the dryer, said wheels being dimensioned to grip a board passing therebetween;
   a pair of nozzle devices, which are elongate and arranged to extend laterally across the board path with their length oblique with respect to the conveyance direction, having an upper nozzle device above the board path and a lower nozzle device below it, for directing respective laterally extensive air jets towards the board path from opposite sides thereof, said pair of nozzle devices being parallel to the flat board path but being offset with respect to each other so the lower nozzle device is arranged slightly upstream in the conveyance direction with respect to the upper nozzle device, and further being angled with respect to the conveyance direction to give the air jets a backward component of direction with respect to a forward conveyance direction so as to ensure that moisture on the board's surface is urged in the direction of a single corner of the board whereupon a single droplet or series of droplets are formed and then sheared from the board by the air jets.

2. A board dryer as claimed in claim 1, wherein said nozzle device are angled at between 90° and 70° to the conveyance direction.

3. A board dryer as claimed in claim 1, wherein said nozzle devices are angled at between 85° and 75° to the conveyance direction.

4. A board dryer as claimed in claim 1, wherein said nozzle devices are angled at between 45° and right angles to the conveyance direction.

5. A board dryer as claimed in claim 4, wherein said nozzle devices are angled at between 50° and 70° to the conveyance direction.

6. A board dryer as claimed in claim 5, wherein said nozzle devices are angled at between 55° and 65° to the conveyance direction.

7. A board dryer as claimed in claim 1, wherein said elongate nozzle devices each include a single slit nozzle adapted to create a generally planar air jet extended laterally of its flow direction.

8. A board dryer as claimed in claim 1, wherein said elongate nozzle devices each include a plurality of individual nozzles spaced along their length adapted to create a generally planar air jet extended laterally of its flow direction.

9. A board dryer as claimed in claim 1, wherein said double-sided conveyor comprises, in the region of said nozzle devices, short wheel-carrying axles, not extending to the full width of the conveyor, to support leading and trailing ends of the board on entry and exit between the nozzle devices.

10. A board dryer as claimed in claim 1, including board inlet baffle means to avoid water blown from the board being blown out of the dryer.

11. A board dryer as claimed in claim 10, wherein said inlet baffle means comprise upper and lower baffles defining an inlet slot therebetween.

12. A board dryer as claimed in claim 11, wherein said inlet baffle means comprise resilient rollers for complete closure of a board inlet to the dryer.

13. A board dryer as claimed in claim 1, including an enclosure for said conveyor and said nozzle devices and air re-circulation means for drawing air from the enclosure and returning it thereto via said nozzle devices for the air jets.

14. A board dryer as claimed in claim 13, wherein said re-circulation means includes a multi-stage fan for providing pressure air to said nozzles devices and consequently heating the air.

15. A board dryer as claimed in claim 14, including a flap and a thermostatic device for opening the flap in the event of the temperature of the air within the enclosure reaching a pre-determined level.

16. A double sided board dryer for drying printed circuit boards comprising:
    a double-sided conveyor for conveying boards through the dryer, said conveyor comprising a plurality of upper and lower axles arranged to extend across the width of the conveyor, each axle carrying a plurality of board gripping wheels attached thereto, the wheels on the upper axles being arranged opposite the corresponding wheels on the lower axles, whereby said conveyor defines by nips of the wheels a flat board path and a conveyance direction in the path through the dryer, said wheals being dimensioned to grip a board passing therebetween;

a pair of nozzle devices, which are elongate and arranged to extend laterally across the board path with their length oblique with respect to the conveyance direction, one above the board path and one below it, for directing respective laterally extensive air jets towards the board path from opposite sides thereof, said pair of nozzle devices being parallel to the flat board path but offset with respect to each other, and further being angled with respect to the conveyance direction to give the air jets a backward component of direction with respect to a forward conveyance direction so as to ensure that moisture on the board's surface is urged in the direction of a single corner of the board whereupon a single droplet or series of droplets are formed and then sheared from the board by the air jets; and said conveyor including two pairs of a short upper and a short lower axle, each having fewer board gripping wheels than the other axles, one pair being arranged upstream of the pair of nozzle devices between the latter and the nearest other full width axles at one side of the conveyor and the other pair being arranged downstream of the pair of nozzle devices between the latter and the nearest other full width axles at the other side of the conveyor, to support leading and trailing ends of the board on entry and exit between the nozzle devices.

* * * * *

UNITED STATES PATENT AND TRADEMARK OFFICE
CERTIFICATE OF CORRECTION

PATENT NO. : 5,165,326
DATED : October 20, 1992
INVENTOR(S) : Lynn

It is certified that error appears in the above-identified patent and that said Letters Patent is hereby corrected as shown below:

At column 3, line 9, please delete "/" between "The" and "board".

At column 4, line 6, please change "device" to --devices--.

At column 4, line 68, please change "wheals" to --wheels--.

Signed and Sealed this

Third Day of May, 1994

BRUCE LEHMAN

Attest:

Attesting Officer

Commissioner of Patents and Trademarks